United States Patent [19]

Mones et al.

[11] 4,273,859
[45] Jun. 16, 1981

[54] METHOD OF FORMING SOLDER BUMP TERMINALS ON SEMICONDUCTOR ELEMENTS

[75] Inventors: Arthur H. Mones, Phoenix, Ariz.; Jack A. Sartell, Bloomington; Vahram S. Kardashian, Plymouth, both of Minn.

[73] Assignee: Honeywell Information Systems Inc., Phoenix, Ariz.

[21] Appl. No.: 108,760

[22] Filed: Dec. 31, 1979

[51] Int. Cl.³ .......................................... H01L 21/88
[52] U.S. Cl. ................... 430/315; 156/643; 228/180 A; 427/89; 427/96; 357/67; 430/314; 430/329; 430/330
[58] Field of Search ............... 427/89, 96; 430/314, 430/315, 329, 330; 228/180 A; 357/67; 156/643

[56] References Cited

U.S. PATENT DOCUMENTS

| | | | |
|---|---|---|---|
| 4,042,954 | 8/1977 | Harris | 427/89 |
| 4,057,659 | 11/1977 | Pammer et al. | 427/89 |
| 4,172,907 | 10/1979 | Mones et al. | 427/96 |
| 4,182,781 | 1/1980 | Hooper et al. | 430/314 |
| 4,188,438 | 2/1980 | Burns | 427/96 |

OTHER PUBLICATIONS

A. van der Drift et al., "Integrated Circuits with Leads on Flexible Tape", Solid State Technology/Feb. 1976, pp. 27–35.

Primary Examiner—John D. Smith
Attorney, Agent, or Firm—Edward W. Hughes; Wm. W. Holloway, Jr.; Ronald T. Reiling

[57] ABSTRACT

An improved method of forming raised input/output (I/O) terminals on the top surfaces of semiconductor elements of a semiconductor wafer. After via openings are formed through the passivation layer of such elements at locations where the I/O terminals are to be formed, which openings provide access to the metalization layers of the elements photolithographic techniques using a layer of heat resistant photoresist which is laminated to the top surface of the wafer are used to form openings through the photoresist layer to provide access to the metalization layers through the vias. A barrier metal layer is deposited on the exposed surfaces of the photoresist, and the metalization layers, and passivation layer of the elements. The barrier metal layer overlying the photoresist and then the photoresist are stripped from the wafer. The same photolithographic techniques using the same heat resistant photoresist material are used to define openings surrounding the barrier metal lining the via openings. A layer of solder is then deposited on the wafer. The solder overlying the photoresist and then the photoresist are stripped from the wafer. The solder is heated until it reflows to form raised I/O terminals of the devices which terminals each will have a substantially spherical exposed surface.

10 Claims, 3 Drawing Figures

METHOD OF FORMING SOLDER BUMP TERMINALS ON SEMICONDUCTOR ELEMENTS

BACKGROUND OF THE INVENTION

1. Field of the Invention

This invention is in the field of methods of forming raised input/output terminals on the top, or exposed, surfaces of semiconductor elements while the elements are still integral with the single crystal silicon wafer on which the elements are formed. A photolithographic process using a layer of heat resistant photoresist material is used to form masks through which barrier metal layers of each I/O terminal are deposited on exposed portions of the metalization layers of such elements. The same photolithographic process is used to form a mask through which a layer of solder is then deposited on the exposed surface of the barrier metal layer of each terminal and an area of the passivation layer surrounding the barrier metal. The solder is melted which results in the I/O terminals having a substantially spherical exposed surface.

2. Description of the Prior Art

Some integrated circuits (IC) chips or elements are provided with raised I/O terminals, or I/O bumps. These I/O terminals are made of various conductive metals such as gold or tin/lead solder, for example. The I/O bumps project a substantial distance above the passivation layer of such elements on the order of 15-26 micrometers, or microns, or 1-2 mils. Semiconductor elements, including those with I/O bumps are generally produced starting with a wafer cut from a single crystal of essentially pure silicon. The I/O bumps of each IC element are formed while the elements are still an integral part of the wafer.

Heretofor, raised solder I/O bumps have been formed after the conventional step of etching holes, or vias, through the passivation layer has been completed to provide access to the metalization layer, commonly aluminum, which is in direct contact with the silicon crystal. The metalization layer underlies a passivation layer of silicon dioxide $SiO_2$ or silicon nitride $Si_3N_4$, for example. Barrier metal layers typically consisting of layers of chromium, copper and gold are deposited by conventional vapor deposition, or sputtering techniques, on the areas of the metalization layer exposed through the via openings. The conventional process for depositing metals on a semiconductor substrate uses a metal mask in which the apertures will have diameters slightly greater than the diameters of the vias by an amount substantially in a range of 2 mils (0.002 inches). A layer of tin lead is then deposited on the barrier metal layers in contact with the metalization layers and the exposed areas of the passivation layer through apertures in a metal mask which apertures are oversized relative to the barrier metal layers previously deposited by about 4 mils. The tin/lead solder is melted and the surface tension of the liquid solder draws the solder overlying the barrier metal layer into a compact mass to form a tin/lead raised I/O terminal or bump, the exposed surfaces of which are substantially spherical.

A major problem encountered when using apertured masks which are typically made from molybdenum arises as the diameters of the semiconductor wafers increased from approximately 1 inch in the early 1960s to 4 inches at the present time with no limit on the maximum diameter of such wafers yet discernible. The differences in the thermal coefficients of expansion of silicon and molybdenum is such as to cause the apertures in the metal mask to move out of alignment, or registry, with the vias previously etched in the passivation layers where the I/O bumps are to be formed to a degree that is not acceptable if semiconductor devices of acceptable quality and at an acceptable cost are to be produced. The misalignment between the openings in a mask and the via openings of the elements of the wafer leads to metalurgical failures, adhesion failures of the barrier metal to the passivation layer, and the formation of poor, or no, electrical contacts with the underlying metalization layer of the elements.

In addition the high temperature associated in vapor depositing or sputtering metals, on IC wafers through a metal mask can cause the metal mask to buckle with the result that excess metal can be deposited which excess metal can result in electrical shorts between I/O terminals, for example. Further since the metal masks must be cleaned after each use, they are subject to damage as the result of being subjected to such cleaning by removal of metal from the masks, by etching, for example, which renders the masks no longer serviceable. As a result the useful lives of such masks are relatively short and their cost, approximately $100/each increases the cost of producing integrated circuit chips having raised I/O bumps.

SUMMARY OF THE INVENTION

The present invention provides an improved method of forming raised I/O terminals, or I/O bumps, on the top surface of IC chips while the IC chips are still integral, i.e., IC elements of a single crystal silicon wafer. Such IC elements have a metalization layer on one of their surfaces, the upper surface, to innerconnect the active electronic devices such as transistors, gates, diodes and passive elements such as resistors of the IC element as well as to provide external electrical connections to the IC element. Overlying the upper surface of the IC elements including their metalization layers is a passivation layer of silicon oxide ($SiO_2$) or siliconnitride ($Si_3N_4$) which protects the upper surfaces of the elements. To make external connections to the metalization layers or conductive runs of the IC elements, openings of small diameter, or vias, are etched through the passivation layer at predetermined locations using photolithographic techniques to form a mask of a suitable temperature resistant photoresist material.

After the vias have been formed a layer of a heat resistant photoresist material such as Dupont's Type 730S RISTON Dry Film Solder Mask or Type SM1 is dry laminated to the top surface of the semiconductor wafer overlying the IC elements of the wafer. The photoresist layer will also overlie the previously formed vias in the passivation layer where the raised I/O bumps are to be formed. The photoresist is exposed through a photomask so that the areas of the layer of photoresist overlying the vias formed in the passivation layer of the IC elements are not polymerized. The exposed layer of photoresist is then developed using an appropriate organic solvent such as 1,1,1 trichloroethane which is sprayed on the photoresist layer to remove the unpolymerized portions so that the vias are exposed plus a small concentric adjacent area of the passivation layer. A barrier metal layer of chrome, copper, gold is then deposited on the exposed surfaces of the photoresist of the metalization layer, and the passivation layer of the IC elements. The barrier metal layer is physically stripped from the photoresist after the substrate has been cooled and then the photoresist is stripped from the passivation layers of the IC element which leaves the barrier metal layer present only in and immediately surrounding each via of each IC element.

Another layer of photoresist is then laminated onto the top surface of the wafer and its IC elements. The layer of photoresist is exposed through a photomask so that the areas of the photoresist overlying the barrier metal layer for each via are not polymerized. The photoresist is then developed to remove the unpolymerized photoresist which exposes the layer of barrier metals of each via and an immediately adjacent concentric area of the passivation layer. A lead/tin solder is then deposited on the exposed surfaces of the photoresist layer, the barrier metal layers of each via and the exposed portions of the passivation layer surrounding the layers of the barrier metal. The tin solder layer overlying the photoresist is mechanically stripped to expose the photoresist which in turn is stripped from the wafer leaving the solder that had been deposited on a barrier metal layer and on a concentric ring of exposed passivation layer around each via. The solder is then heated to melt it, or it is reflowed, which permits the surface tension of the solder which will wet the barrier metal layer but not the passivation layer to form an I/O bump which projects above the barrier metal layer. The exposed surfaces of the I/O bumps so formed will be substantially spherical.

It is, therefor, an object of this invention to provide an improved method of forming raised solder I/O bumps on an IC chip.

It is yet another object of this invention to provide an improved method of forming solder I/O bumps on IC chips in which photolithographic techniques using a layer of heat resistant photoresist material are used to form masks through which layers of a barrier metal and a tin/lead solder are deposited in precisely determined locations on the IC devices.

It is still another object of this invention to provide an improved method of forming raised I/O terminals on IC chips which do not require the use of metal masks in the deposition of metals on such chips in forming raised I/O terminals.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which.

DESCRIPTION OF THE PREFERRED EMBODIMENT

Figure 1:
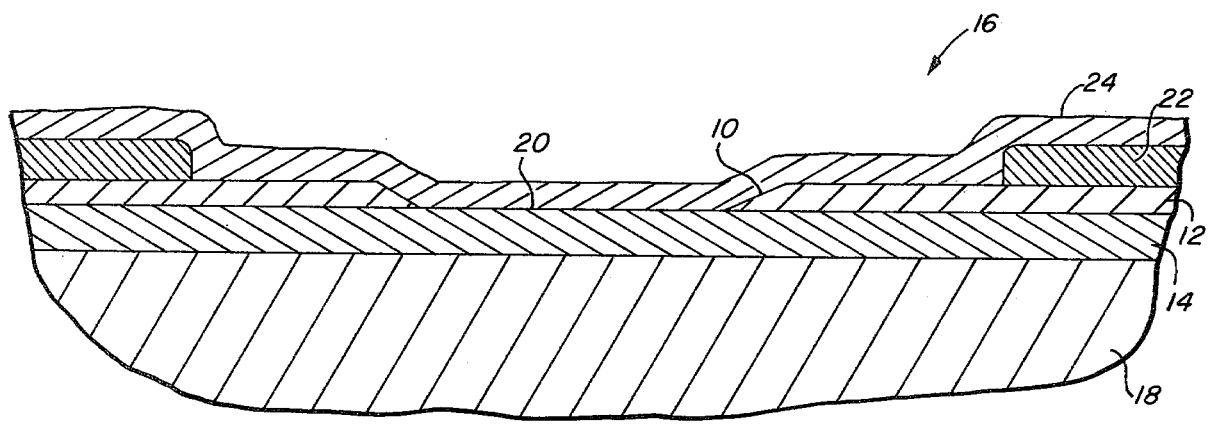
FIG. 1 is an enlarged schematic cross section through a via of an IC element of an IC wafer at the completion of the step of depositing barrier metal layers.
Figure 2:
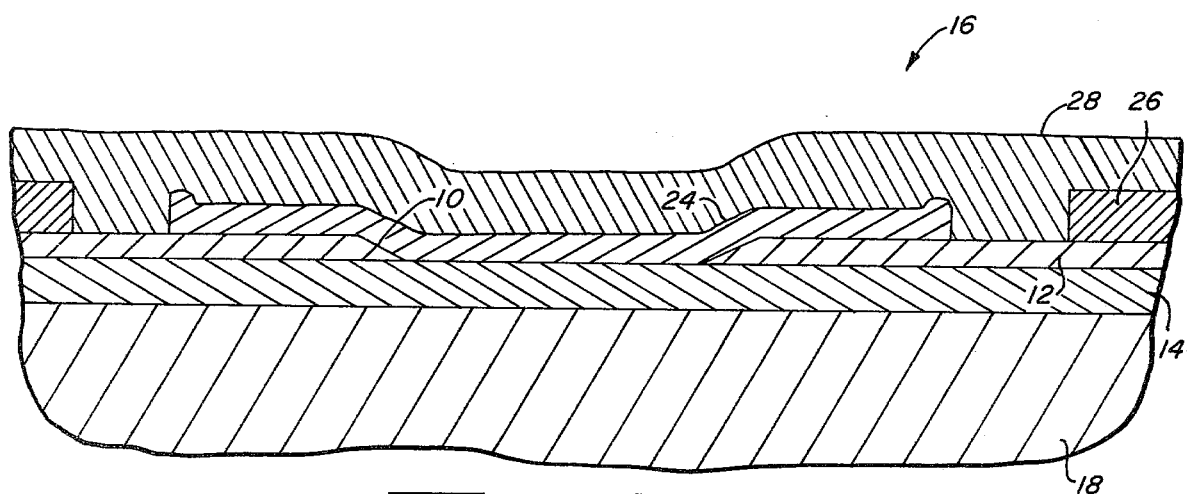
FIG. 2 is a view similar to that of FIG. 1 at the completion of the step of depositing a layer of tin/lead solder.
Figure 3:
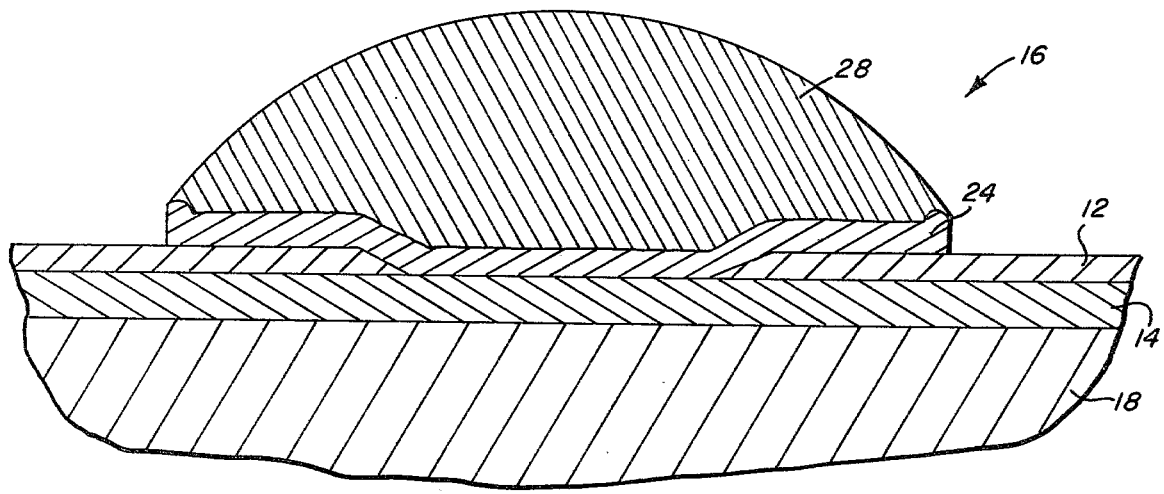
FIG. 3 is a cross section through a raised solder I/O bump of an IC element at the completion of the process of the invention.

Referring to FIG. 1, the steps of the improved method of this invention start after vias such as via 10 illustrated in FIG. 1 has been etched through passivation layer 12 which overlies metalization layer 14 of an IC element 16, only a small part of which is illustrated in FIGS. 1–3. Metalization layer 14 is in direct contact with the upper surface of the single crystal silicon wafer 18 and a portion 20 of the surface of metalization layer 14 is exposed or uncovered by virtue of the existence of via 10.

A layer 22 of a heat resistant photoresist material such as DuPont's Type 730S RISTON Photopolymer Dry Film Solder Mask, or SM1 Dry Film Solder Mask, is dry laminated over the upper surfaces of wafer 14 so that it overlies passivation layer 12 and the vias 10 formed in passivation layer 12 of the IC elements 16 of wafer 18. Layer 22 is exposed by a source of electromagnetic radiation of the proper frequency and intensity for an appropriate period of time through a photomask which is aligned with wafer 18 with the result that areas of layer 22 overlying vias 10 plus a substantially concentric ring having a maximum diameter of approximately 2 mils greater than the diameter of the vias 10 which have a diameter of substantially 2 mils will not be polymerized by the radiation. The exposed layer 22 is then developed by being sprayed with a suitable organic solvent such as 1,1,1 trichloroethane which removes the unpolymerized portions of layer 22. Barrier metal layers 24 of chromium, copper and gold is then deposited in that order by sputtering, or by vapor deposition on to the exposed surfaces of layer 22, on surface 20 of metalization layer 14, and the exposed surfaces of passivation layer 12 surrounding each via 10. To simplify the drawings metal layers 24 are illustrated as being a single layer. The layers of barrier metal overlying photoresist layer 22 are stripped first by heating the substrate 18 to a temperature of slightly more than 300 degrees C. for ten minutes in air so that the differences in the coefficients of thermal expansion between the barrier metal layers 24 and photoresist layer 22 will separate barrier metal layers 24 from photoresist layer 22. After the substrate has been cooled, the barrier metal layers 24 overlying the photoresist can be easily lifted off, or mechanically removed from, the layer of photoresist 22. The layer of photoresist 22 is then stripped from wafer 18 by plasma etching, or by use of a chemical solvent such as ethylene chloride, with the result that all of the barrier metal layer 24 that remains is that deposited on the exposed surfaces 20 of the metalization layer 14 and the exposed surfaces of the passivation layer 12 forming and immediately surrounding each via 10 as is best illustrated in FIG. 2.

A second layer 26 of heat resistant photoresist material is dry laminated over the upper surfaces of wafer 18 which includes the exposed surfaces of passivation layer 12 and the exposed surfaces of the barrier metal layers 24 for each via 10 of the elements 16 of wafer 18. The layer of photoresist material 26 is then exposed by an appropriate source of radiant energy through a photomask with which wafer 18 is precisely aligned so that the areas of layer 26 overlying the barrier metal layers 24 of each via 10 plus a substantially concentric ring of a maximum diameter of substantially 4 mils greater in diameter than the maximum diameter of the barier metal layer 24 will not be polymerized. Layer 26 is then developed to remove the unpolymerized photoresist material overlying the barrier metal layers 24 of each of the vias 10 of the elements 16 plus the concentric portion surrounding the layers of barrier metal 24. After the development of layer 26, a layer 28 of tin/lead solder in the preferred embodiment is deposited on the exposed surfaces of layer 26 and the exposed surfaces of the barrier metal layer 24 of each of the vias 10 and the exposed areas of the passivation layer 12 between the barrier metal layer 24 and the photoresist layer 26 for each of the vias 10 as illustrated in FIG. 2. The substrate 18 is then heated to a temperature at which the lead/tin metal overlying the photoresist layer 26, which the solder does not wet, is physically separated due to the differences in the coefficients of expansion between them so that after cooling, the layer of lead/tin over the photoresist 26 can be mechanically lifted. Photoresist layer 26 is then stripped from the upper surface of the element 16 of the wafer by plasma etching or by the use of an appropriate organic material such as ethylene chloride. The solder layers 28 are then reheated until they melt, or reflow, which causes the surface tension of the solder which wets the exposed surfaces of the barrier metal layer 24 but not that of the passivation layer 12 to draw the solder into a truncated spherical shape such as that illustrated in FIG. 3 which projects approximately 4 mils above passivation layer 12.

The equipment used to develop the layers of photoresist, is a Tamarack Scientific, Model 2009 Ultraviolet Light Source and Colinator which produces ultraviolet radiation of a nominal 3800 Angstroms. The time of exposure is not critical on the order of 30 to 90 seconds.

To develop the photoresist the substrate or the wafer is subjected to a fine spray of 1,1,1 trichloroethane which is supplied through a nozzle in which both the fluid and the nozzle air pressure are substantially at 40 psi. The wafer is spun at a speed of 4,000 RPM while being subjected to the spray for from 15 to 25 seconds with a 5 second spin dry after spray development. The tip of the spray head, in the preferred embodiment, is 2½ inches up and 1½ inches off the center of the wafer. The proper spray time for development will vary to some extent depending on the composition of the photoresist. The deposition of the barrier metal layer and the tin/lead solder is accomplished using a Perkin Elmer Model 2400 Sputter System. Heating the surface of the wafer to a little over 300 degrees C. is adequate to physically separate the overlying metal layers from the underlying thermal resist layers.

The thickness of the barrier metal layers are substantially as follows: chrome 1000 A copper 5000-10,000 A gold 1,000-2000 A and the thickness of the solder layer is substantially 100 micrometers.

In order to reflow the solder after the photoresist material has been stripped, the solder is heated in air to a temperature at which the solder melts. The wafer is then cooled immediately thereafter. The preferred method of removing the photoresist layer, or stripping it, is by means of a plasma etcher such as a Barrel Etcher made by Dionex, Inc.

From the foregoing it is obvious that this invention provides a photolithographic technique for forming masks for the deposition of the metal barrier layers and the solder layers onto the IC elements of the wafer to form raised solder I/O terminals which is significantly more precise and can be practiced at significantly lower costs then prior art processes.

What is claimed is:

1. Method of forming solder bump terminals on semiconductor elements of a silicon wafer, each element having a metalization layer, and a passivation layer overlying the metalization layer, vias formed through the passivation layer providing access to the metalization layer where solder bump terminals are to be formed;

the method comprising the steps of:
applying a layer of heat resistant photoresist material over the passivation layer of the elements of the wafer;
exposing the photoresist through a photomask so that the areas of the photoresist layer overlying the via openings are unpolymerized;
developing the photoresist to remove the unpolymerized areas of the photoresist area so that the vias are exposed;
depositing barrier metal layers on the wafer;
removing the layers of barrier metal overlying the photoresist and photoresist material from the wafer;
applying a second layer of photoresist material over the surface of the wafer;
exposing the second layer of photoresist layer through a photomask causing the areas of the photoresist material overlying the barrier metal layers of each via to remain unpolymerized;
developing the exposed photoresist to remove the unpolymerized photoresist material overlying the barrier metal layers;
depositing a layer of tin/lead solder on the wafer;
stripping the layer of photoresist material and the layer of tin/lead solder overlying the remaining photoresist material; and
heating the wafer to cause the solder to reflow to form raised solder bump terminals over the barrier metal layers of each via, said solder terminals having a substantially spherical exposed surface.

2. The method of claim 1 in which the photoresist layers are a photopolymer sandwiched between a polyester film and a polyolefin film.

3. The method of claim 2 in which the step of developing the photoresist comprises spraying the exposed photoresist with an organic solvent.

4. The method of claim 3 in which the organic solvent is 1,1,1 trichloroethane.

5. The method of claim 2 in which the barrier metal layers comprise layers of chromium, copper and gold.

6. Method of forming tin/lead solder I/O terminals on semiconductor elements of a silicon wafer, said wafer having a substantially planar surface on which the I/O terminals are to be located, each element having a metalization layer and a passivation layer overlying the metalization layer on said surface;
a plurality of vias formed through the passivation layer to provide access to the metalization layer of each element where the I/O terminals are to be formed; the method comprising the steps of:
laminating a layer of heat resistant photoresist material over the substantially planar surface of the wafer on which the I/O terminals are to be located
exposing the photoresist from a source of ultraviolet radiation through a photomask so that areas of the photoresist overlying the vias and a substantially concentric area of the adjacent passivation layer remain unpolymerized;
developing the exposed layer of photoresist by spraying with an organic solvent to remove the unpolymerized areas of the layer of photoresist;
depositing barrier metal layers on the exposed surfaces of the layers of photoresist, the metalization layer, and passivation layer surrounding each via;

stripping the barrier metal layers from the photoresist by heating the barrier metal layer and the photoresist layer until they physically separate;

plasma etching the photoresist until it is substantially completely oxidized;

laminating a second layer of heat resistant photoresist over the substantially planar surface of the wafer on which the I/O terminals are to be located;

exposing the photoresist to a source of ultraviolet radiation through a photomask so that areas of the photoresist overlying the barrier metal layers and a substantially concentric area of adjacent passivation layer remains unpolymerized;

developing the exposed layer of photoresist by spraying with an organic solvent to remove the unpolymerized areas of the second layer of photoresist;

depositing a layer of tin/lead solder on the exposed surfaces of the layers of photoresist, barrier metal layers, and passivation layer surrounding each via;

stripping the solder layer from the photoresist by heating the solder layer and photoresist layer to a temperature below the melting point of the solder at which the solder physically separates from the photoresist;

plasma etching the second layer of photoresist until it is substantially completely oxidized;

heating the layer of solder to the melting point of the solder and then coating the wafer.

7. The method of claim 6 in which the first and second layers of photoresist are a layer of a photopolymer sandwiched between a polyester film and a polypolefin film.

8. The method of claim 7 in which the organic solvent used to develop the exposed layers of photoresist is 1,1,1 trichloroethane.

9. The method of claim 8 in which the barrier metal layers are layers of chromium, copper and gold.

10. The method of claim 9 in which the temperature to which the solder layer is heated to physically separate the solder layer from the second layer of photoresist is substantially 300 degrees C.

* * * * *